United States Patent
Konishi

[11] Patent Number: 5,153,855
[45] Date of Patent: Oct. 6, 1992

[54] SEMICONDUCTOR NONVOLATILE MEMORY DEVICE INTEGRATED WITH BOOSTER

[75] Inventor: Haruo Konishi, Tokyo, Japan
[73] Assignee: Seiko Instruments Inc., Japan
[21] Appl. No.: 553,778
[22] Filed: Jul. 13, 1990
[30] Foreign Application Priority Data Jul. 14, 1989 [JP] Japan ................... 1-183101

[51] Int. Cl.⁵ ............................................. G11C 13/00
[52] U.S. Cl. ............................ 365/229; 365/189.11; 365/226
[58] Field of Search .................... 365/189.11, 226, 229

[56] References Cited

U.S. PATENT DOCUMENTS 4,290,119 9/1981 Masuda et al. .................. 365/229

Primary Examiner—Terrell W. Fears
Attorney, Agent, or Firm—Bruce L. Adams; Van C. Wilks

[57] ABSTRACT

The nonvolatile memory includes a voltage booster and a supply voltage detection circuit, which is powered only when the voltage booster is operated so as to limit current consumption of the supply voltage detection circuit to substantially only leakage current during a non-operation period of the booster.

6 Claims, 2 Drawing Sheets

FIG. 1
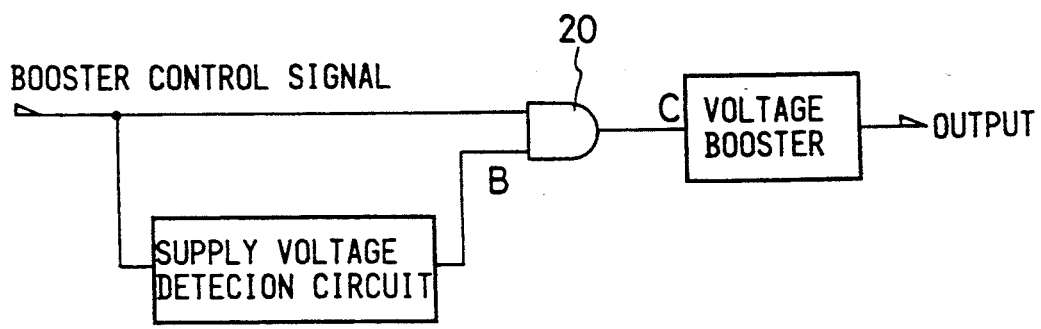
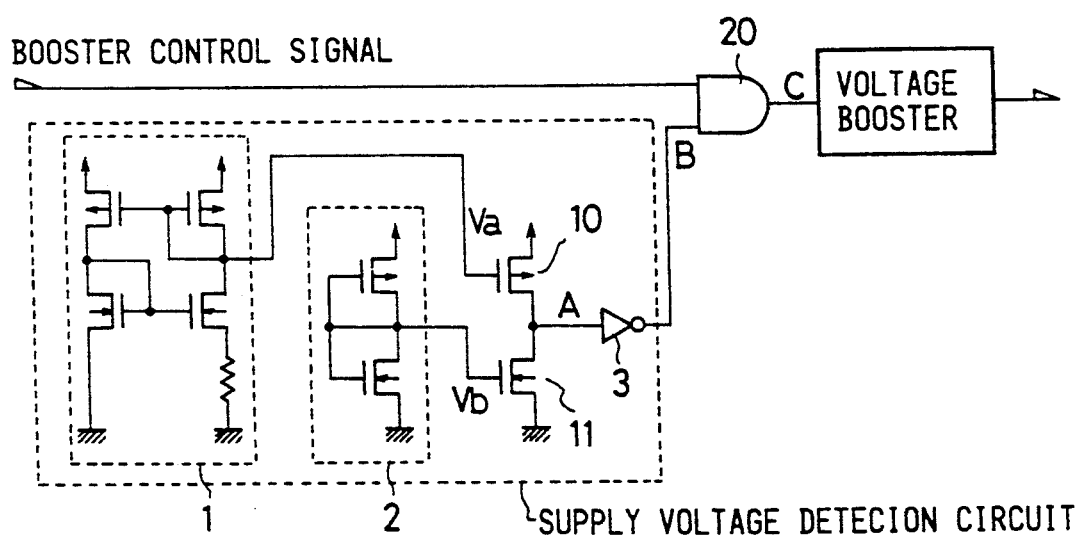
FIG. 2 PRIOR ART

SEMICONDUCTOR NONVOLATILE MEMORY DEVICE INTEGRATED WITH BOOSTER

BACKGROUND OF THE INVENTION

The present invention relates to a nonvolatile memory device integrated with a voltage booster.

Generally, rewriting of the nonvolatile memory requires a high operating voltage, for example, about 20V. FIG. 3 shows the performance of a voltage booster, where the voltage booster cannot generate a desired high voltage when the power source voltage falls below a certain level, for example, 2.5V. Therefore, the nonvolatile memory cannot effect a rewriting operation under such a level of the power source voltage. In view of this, as shown in FIG. 2, conventionally a power source voltage detection circuit is utilized and is always operated so as to forcibly inhibit operation of the voltage booster when the detection circuit detects that the power source voltage falls below a certain level, for example, 3.0V even if an enabling signal has been generated to operate the booster, thereby preventing erroneous or insufficient rewriting of the nonvolatile memory.

The power source voltage detection circuit includes a constant voltage circuit 1 operative to apply a constant voltage $V_a$ to a gate electrode of P channel transistor 10 to enable the same to flow a constant $I_{10}$. Then, a circuit 2 applies a voltage $V_b$ dependent on the power source voltage or supply voltage to a gate electrode of N channel transistor 11. When the supply voltage is in a lower level, the N channel transistor 11 is turned off to hold a node A at "H" level. Therefore, an output B of the supply voltage detection circuit is held at "L" level. On the other hand, when the supply voltage exceeds a given level, the N channel transistor 11 is turned on to lower the voltage level of node A below an inversion voltage of inverter 3. Consequently, the output B of the supply voltage detection circuit is turned to "H" level. As a result, when the supply voltage is below the predetermined level, the output of the supply voltage detection circuit is held at "L" level. Therefore, an input C of the booster is held at "L" level effective to inhibit operation of the booster even if a control signal is turned to "H" level so as to enable the booster.

However, the conventional supply voltage detection circuit is always maintained in an operating state even during other than a necessary duration of boosting operation, thereby causing the drawback that unnecessary current is consumed.

SUMMARY OF THE INVENTION

In order to remove such a drawback of the prior art, an object of the present invention is to control the supply voltage detection circuit in a nonoperative state during unnecessary duration to thereby limit current consumption within leakage.

In order to achieve the object, according to the present invention, the supply voltage detection circuit is controlled by a booster control signal effective to inhibit operation of the supply voltage detection circuit when the voltage booster is held in a nonoperative state to thereby limit current consumption to only leakage of current.

By such construction, upon receipt of a control signal effective to initiate the voltage booster, the supply voltage detection circuit starts to operate to detect whether the supply voltage is above a predetermined reference voltage. According to the detection results, the operation of voltage booster is controlled such that current consumption of the supply voltage detection circuit can be reduced to substantially only leakage current when the voltage booster is in a standing state.

BRIEF DESCRIPTION OF THE DRAWINGS

FIG. 1 is a schematic block diagram of the inventive booster control circuit;

FIG. 2 is a diagram of the conventional booster control circuit;

DETAILED DESCRIPTION OF THE INVENTION

Hereinafter, embodiments of the present invention will be described in conjunction with the drawings. Reference to FIG. 1, a booster control signal is held at "H" level when initiating operation of a voltage booster and is held at "L" level when placing the booster in stand still. A supply voltage detection circuit operates when the booster control signal has "L" level to output "L" level signal, and operates when the booster control signal has "H" level to detect the supply voltage, such that when the supply voltage is above a predetermined level the "H" level signal is outputted, and when the supply voltage is below the predetermined level the "L" level signal is outputted. The voltage booster operates when its input is held at "H" level to produce a high or boosted voltage, and operates when its input is held at "L" level to output an "L" level signal. The booster control signal is fed to an input terminal of the supply voltage detection circuit and to one input terminal of a two-input AND circuit 20. The output terminal of the AND circuit 20 is connected to the input terminal of the voltage booster.

The next description is given for the operation. Firstly, when inhibiting operation of the voltage booster, the booster control signal is turned to "L" level to hold the input terminal C of the booster at "L" level. Concurrently at this time, the output B of the supply voltage detection circuit is held also at "L" level. Next, when operating the voltage booster, the booster control signal is turned to "H" level to set the supply voltage detection circuit in an operative state. Then, the supply voltage detection circuit outputs "H" level signal when the supply voltage is above the predetermined reference voltage so that the input C of the booster is turned to "H" level effective to start operation of the booster. On the other hand, when the supply voltage is below the reference level, the detection circuit outputs "L" level signal so that the input terminal of the booster is maintained "L" level to avoid operation of the voltage booster.

Figure 4:
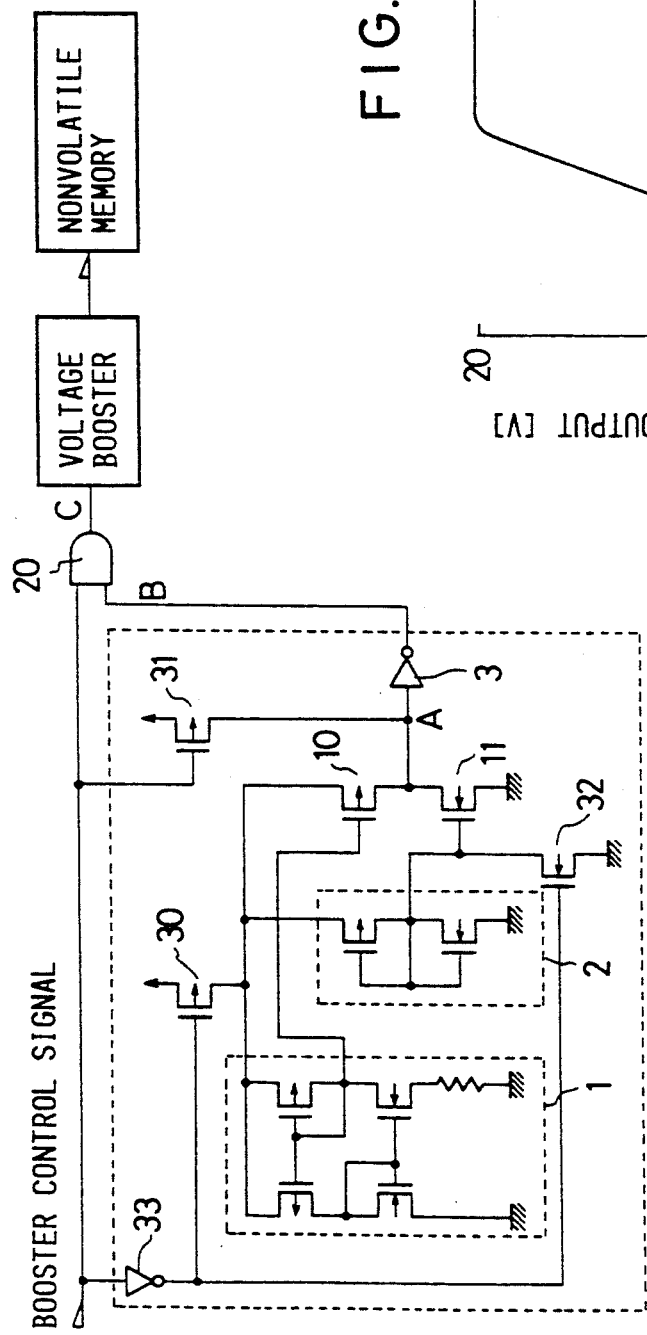
FIG. 4 is a diagram showing an embodiment of the inventive booster control circuit.
Figure 3:
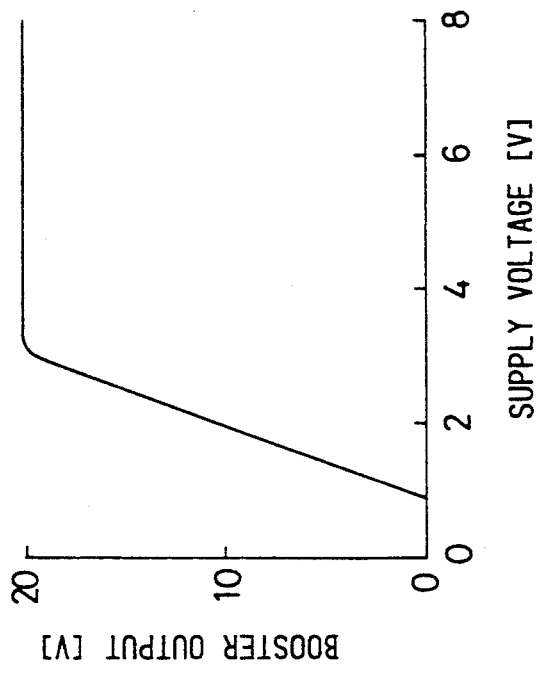
FIG. 3 is a waveform diagram of the voltage booster.

FIG. 4 is a detailed circuit diagram showing an embodiment of the invention, constructed such that P channel transistors 30 and 31, N channel transistor 32 and inverter 33 are added into the structure of the conventional supply voltage detection circuit shown in FIG. 2. The supply voltage detection circuit is provided with P channel transistor 30 interconnected between the supply voltage line and those of constant voltage circuit 1, circuit 2 for outputting a voltage dependent on the supply voltage and P channel transistor 10. N channel transistor 32 is interconnected between a gate electrode of N channel transistor 11 and the ground line. The gate electrodes of the respective P channel transistor 30 and N channel transistor 32 are inputted with an inverted booster control signal inverted by the inventer 33. Further, P channel transistor 31 is interconnected between an input terminal of inverter 3 and the supply voltage line, and the gate electrode of P channel transistor 31 is inputted with the booster control signal. The booster control signal and output B of the supply voltage detection circuit are applied to respective input terminals of two-input AND circuit 20, and output of the AND circuit 20 is connected to input C of the voltage booster which supplies a boosted voltage to a nonvolatile memory.

The next description is given for the operation of the embodiment. Firstly, when inhibiting operation of the voltage booster, the booster control signal is turned to "L" level to hold the input C of the booster at "L" level. At this time, the gate electrode of P channel transistor 30 is held at "H" level through inverter 33 so as to turn off P channel transistor 30. Consequently, no supply voltage is applied to the constant voltage circuit 1, circuit 2 for outputting a voltage dependent on the supply voltage and P channel transistor 10 to thereby limit current consumption of the supply voltage detection circuit to only leakage current. Further, the gate electrode of N channel transistor 32 is held also at "H" level to turn on N channel transistor 32. Consequently, the gate of N channel transistor 11 is held at "L" level to turn off N channel transistor 11. The gate electrode of P channel transistor 31 is held at "L" level to turn on P channel transistor 31. Consequently, the node A is held at "H" level and output B of the supply voltage detection circuit is held at "L" level through inverter 3. The P channel transistor 31 and N channel transistor 32 cooperate to fix the node A to "H" level so as to eliminate a feedthrough current in inverter 3.

Next, when operating the booster, the booster control signal is turned to "H" level so that the gate electrode of P channel transistor 30 is set to "L" level so as to turn on P channel transistor 30 to thereby apply the supply voltage to constant voltage circuit 1, circuit 2 for outputting a voltage dependent on the supply voltage and P channel transistor 10 to operate or power those circuits. At this time, the gate electrode of P channel transistor 31 is set to "H" level and the gate electrode of N channel transistor 32 is set to "L" level through inverter 33. Therefore, both P channel transistor 31 and N channel transistor 32 are turned off such that the node A is not set to "H" level. Then, in a manner similar to the prior art shown in FIG. 2, the inventive supply voltage detection circuit outputs "H" level signal when the supply voltage is above the reference level so that input C of the voltage booster is turned to "H" level to start operation. On the other hand, when the supply voltage is below the reference level, the supply voltage detection circuit outputs "L" level signal so that input C of the voltage booster is held at "L" level to suspend its operation. As described, the supply voltage detection circuit is operated or powered only when operating the voltage booster. Therefore, current consumption can be saved within leakage amounts in the supply voltage detection circuit when the voltage booster is not operated.

As described above, according to the present invention, the supply voltage detection circuit is controlled according to the booster control signal to operate only when there is a voltage-boosting operation. Therefore, during other than the boosting operation period, the current consumption is limited to leakage current, thereby advantageously reducing power consumption particularly in a standing period.

What is the Claimed is:

1. A semiconductor nonvolatile memory device comprising:

a supply voltage detection circuit controllable by a booster control signal to operate for detecting if a power supply voltage applied thereto is above a predetermined level and for producing an output signal corresponding thereto only when the booster control signal is present;

logic means receptive of the booster control signal and the output signal from the supply voltage detection circuit for performing a logic operation and producing an output signal;

a voltage booster controlled by an output signal from the logic means only when the supply voltage detection circuit is operating and when the output signal from the supply voltage detection circuit shows that the power supply voltage is above the predetermined level; and a nonvolatile memory operated by a boosted voltage from the voltage booster.

2. A semiconductor nonvolatile memory device as claimed in claim 1, wherein the logic means comprises an AND gate.

3. A semiconductor nonvolatile memory device as claimed in claim 2, wherein the output signal from the voltage detection circuit is held at a high level when the supply voltage is above a predetermined level.

4. A semiconductor nonvolatile memory device comprising:

means receptive of a power supply voltage for detecting if the power supply voltage is greater than a predetermined level comprising means responsive to a control signal for permitting detection when the control signal is at a first logic level and preventing detection when the control signal is at a second logic level, and means for producing an output signal at one logic level when the control signal is at the first logic level and the power supply voltage is greater then the predetermined level and for producing an output signal at a second logic level when the control signal is at the second logic level of the power supply voltage is less then the predetermined level;

logic means receptive of the control signal and the output signal for producing a first logic output signal when the control signal is at a first logic level and the output signal is at the one logic level;

a voltage booster only operative in responsive to the first logic output signal to produce a boosted voltage; and a nonvolatile semiconductor memory operated by the booster voltage.

5. The semiconductor nonvolatile memory device according to claim 4, wherein the logic means comprises an AND gate.

6. The semiconductor nonvolatile memory device according to claim 5, wherein the control signal and the output signal are both high to produce the first logic output.

* * * * *